(12) United States Patent
Jeong

(10) Patent No.: US 7,266,029 B2
(45) Date of Patent: Sep. 4, 2007

(54) NONVOLATILE MEMORY DEVICES INCLUDING OVERLAPPED DATA SENSING AND VERIFICATION AND METHODS OF VERIFYING DATA IN NONVOLATILE MEMORY DEVICES

(76) Inventor: Jae-Yong Jeong, 102-101 LG Apt., Jukhyeon-maeul, Bojeong-ri, Guseong-eup, Yongin-si, Gyeonggi-do (KR)

(*) Notice: Subject to any disclaimer, the term of this patent is extended or adjusted under 35 U.S.C. 154(b) by 60 days.

(21) Appl. No.: 11/017,335

(22) Filed: Dec. 20, 2004

(65) Prior Publication Data
US 2006/0067130 A1    Mar. 30, 2006

(30) Foreign Application Priority Data
Sep. 30, 2004    (KR) .................. 10-2004-0077925

(51) Int. Cl.
*G11C 7/02* (2006.01)
(52) U.S. Cl. ............ 365/207; 365/185.22; 365/185.29; 365/185.3; 365/189.05
(58) Field of Classification Search ................ 365/207, 365/185.3, 185.22, 185.29, 189.05
See application file for complete search history.

(56) References Cited

U.S. PATENT DOCUMENTS 5,422,842 A * 6/1995 Cernea et al. ......... 365/185.22
5,986,929 A * 11/1999 Sugiura et al. ........ 365/185.03
6,122,197 A * 9/2000 Sinai et al. ............ 365/185.22
6,259,628 B1 * 7/2001 Park ..................... 365/185.22

FOREIGN PATENT DOCUMENTS

| JP | 2000-348492 | 12/2000 |
| JP | 2002-025280 | 1/2002 |
| KR | 10-2002-0047772 | 6/2002 |
| KR | 10-2003-0089316 | 11/2003 |

* cited by examiner

*Primary Examiner*—Richard T. Elms
*Assistant Examiner*—Eric Wendler
(74) *Attorney, Agent, or Firm*—Myers Bigel Sibley & Sajovec

(57) ABSTRACT

Data verification methods and/or nonvolatile memory devices are provided that concurrently detect data for a selected memory cell of the nonvolatile memory device and verify a programmed or erase state of previously detected data of a different memory cell of the nonvolatile memory device. Concurrently detecting data and verifying a programmed or erase state may be provided by a sense amplifier configured to sense data from a memory cell of the nonvolatile memory device, a latch configured to store the data sensed by the sense amplifier, an I/O buffer configured to store the data stored in the latch and a program/erase verifier circuit configured to control the sense amplifier, latch and I/O buffer to provided previously sensed data for a first memory cell to the program erase/verifier circuit for verification while the sense amplifier is sensing data for a second memory cell.

21 Claims, 4 Drawing Sheets

NONVOLATILE MEMORY DEVICES INCLUDING OVERLAPPED DATA SENSING AND VERIFICATION AND METHODS OF VERIFYING DATA IN NONVOLATILE MEMORY DEVICES

CROSS-REFERENCE TO RELATED APPLICATIONS

This U.S. non-provisional patent application claims priority under 35 U.S.C. § 119 from Korean Patent Application 2004-77925 filed on Sep. 30, 2004, the disclosure of which is incorporated herein by reference as if set forth in its entirety.

FIELD OF THE INVENTION

Embodiments of the present invention relate to nonvolatile memory devices and more particularly to verification of data in nonvolatile memory devices.

BACKGROUND OF THE INVENTION

Among nonvolatile semiconductor memory devices capable of being electrically programmed, erased and read, NOR flash memory devices may be particularly advantageous because they typically provide for high-frequency operations in programming and reading data.

FIG. 1 is a cross-sectional diagram of a conventional flash memory cell. The flash memory cell is constructed of source and drain regions, 3 and 4, formed of N+ impurities in a P-type semiconductor substrate 2, with a channel region interposed therebetween, a floating gate 6 over the channel region with a thin insulation film less than 100 Å interposed between the floating gate 6 and the channel region. A control gate 8 is isolated from the floating gate 6 with an insulation film 9 interposed between them. Voltage terminals Vs, Vg, Vd, and Vb are provided for supplying voltages while programming, erasing, or reading data and are connected to the source region 3, the drain region 4, the control gate 8, and the semiconductor substrate 2, respectively.

The flash memory cell is programmed by the effect of hot electron injection towards the floating gate from the channel region adjacent to the drain region 4. The electron injection is carried out with the bias condition that the source region 3 and the P-type semiconductor substrate 2 are grounded, a high voltage, e.g., 10V, is applied to the control gate 8, and a voltage of 5~6V to induce hot electrons is applied to the drain region. If the flash memory cell is programmed by applying such voltages, negative charge (electrons) accumulates in the floating gate 6. The negative charge accumulated in the floating gate increases a threshold voltage of the programmed flash memory cell during a read operation.

In an erase operation, the flash memory cell is erased by the Fowler-Nordheim (F-N) tunneling effect to the control gate 6 from the semiconductor substrate (i.e., bulk) 2. The F-N tunneling is provided by a negative high voltage of −10V being applied to the control gate 8 and a positive voltage of 5V being established between the bulk region and the control gate 8 to induce the F-N tunneling. Under such conditions, the drain region 4 is in a high impedance state (e.g., a floating state) in order to maximize the effectiveness of the erase operation. When the bias voltages according to the erase operation are applied to the corresponding voltage terminals Vg, Vd, Vs, and Vb, an electric field is strengthened between the control gate 8 and the bulk region (i.e., the substrate 2), which enables the F-N tunneling effect to discharge the negative charges to the source region 3 from the floating gate 6. The F-N tunneling may be induced by an electric field of 6~7MV/cm, which is possible because the thin insulation film of under 100 Å is interposed between the floating gate 6 and the bulk region 2.

In a conventional flash memory device structure, as each bulk region includes a plurality of memory cells. The memory cells in each bulk region are erased as a group. The size of the groups that are erased is, typically, determined by division of the semiconductor bulk material into regions. For example the group or unit of memory cells that are all erased in an erase operation may be referred to as a sector of, for example, 64 Kb.

The flash memory cell has a low threshold voltage after the erase operation and forms a current path between the drain region 3 and the source region 4 in response to a voltage supplied to the control gate 8 during a read operation. Thus, the flash memory cell is detected as an on-cell if it has its threshold voltage in the range of 1~3V.

After completing the programming and erase operations, it may be necessary to detect whether the operations have been successfully completed, i.e., program and/or erase verification.

FIG. 2 shows variations of cell threshold voltages in accordance with programming and erasing operations in a flash memory device. As illustrated in FIG. 2, the NOR flash memory device is adjusted to have a threshold voltage of 6~8V when programmed and a threshold voltage of 1~3V when erased. The erase operation is carried out until the threshold voltage is established in the range of 1~3V. However, if an erased memory cell has a threshold voltage of 4V after a first erase operation and the threshold voltage decreases by a predetermined amount with each erase operation, a subsequent erase operation may result in the memory cell having a threshold voltage under 1V. In such a case, the threshold voltage thereof is increased. The case where a flash memory cell has been erased and results in a threshold voltage less than 1V is referred to as an over-erased state, and the lowered threshold voltage is increased by way of an erasing repair process.

As discussed above, there is a need to verify if a flash memory cell has been programmed or erased in order to assure the results of the programming or erasing operation. From the verifying operation, under-programmed memory cells can be completely programmed by further carrying out the programming operation and under-erased or over-erased memory cells can be adjusted to correct insufficient threshold voltages.

SUMMARY OF THE INVENTION

Some embodiments of the present invention provide nonvolatile memory devices that include a data detection circuit configured to sense data of a selected memory cell of a memory cell array after a programming or erasing operation of the selected memory, a data storage unit configured to store the sensed data and a verifier circuit configured to verify programmed or erased data stored in the data storage unit while the data detector is sensing new programmed or erased data.

In further embodiments of the present invention, the verifier circuit control data input and output operations for the data storage unit. The verifier circuit may confirm the programmed or erased state individually for each bit of the data. The verifier circuit could confirm the programmed or erased state commonly for a plurality of bits of the data.

Some embodiments of the present invention provide nonvolatile memory devices that include a first data storage unit configured to store data for programming or erasing memory cells of the nonvolatile memory device, a data detector circuit configured to sense data of a selected memory cell after a programming or erasing operation with the data stored in the first data storage unit, a second data storage unit configured to store the sensed data and a verifier circuit configured to transfer the data from the second data storage unit to the first data storage unit and verify the sensed data stored in the first data storage unit concurrent with the data detector circuit sensing new programmed or erased data.

In additional embodiments of the present invention, the verifier circuit controls data input and output operations for the first and second data storage units. The verifier circuit may confirm the programmed or erased state for each bit of the data individually. The verifier circuit could confirm the programmed or erased state commonly for a plurality of bits of the data.

Additionally, the first data storage unit may be an input/output buffer. The second data storage unit may be a latch circuit.

Still further embodiments of the present invention provide methods and/or nonvolatile memory devices that concurrently detect data for a selected memory cell of the nonvolatile memory device and verify a programmed or erase state of previously detected data of a different memory cell of the nonvolatile memory device. The previously detected data may be detected data that was immediately previously detected.

Methods and/or devices according to some embodiments of the present invention program or erase memory cells of the nonvolatile memory device with external data stored in a first data storage unit. A result of the data detection may be stored in a second data storage unit. Furthermore, concurrently detecting data for a selected memory cell and verifying a programmed or erase state of previously detected data may include storing the data from the second storage unit in the first data storage unit and verifying a programmed or erase state for the data stored in the first data storage unit while detecting new data.

In still further embodiments of the present invention, concurrently detecting data for a selected memory cell and verifying a programmed or erase state of previously detected data includes confirming the programmed or erase state for each bit of the data individually. Concurrently detecting data for a selected memory cell and verifying a programmed or erase state of previously detected data may include confirming the programmed or erase state commonly for a plurality of bits of the data.

Still further embodiments of the present invention provide methods of verifying data in a nonvolatile memory device that include programming or erasing data for memory cells of a memory cell array with data stored in a first data storage unit;, sensing data of a selected memory cell, storing the data sensed from the selected memory cell in a second storage unit, storing the data from the second storage unit in the first data storage unit and concurrently detecting new data and verifying a programmed or erase state for the data stored in the first data storage unit.

Additional embodiments of the present invention provide nonvolatile memory devices that include means for concurrently detecting data for a selected memory cell and verifying a programmed or erase state of previously detected data of a different memory cell. The means for concurrently detecting data and verifying a programmed or erase state may include a sense amplifier configured to sense data from a memory cell of the nonvolatile memory device, a latch configured to store the data sensed by the sense amplifier, an I/O buffer configured to store the data stored in the latch and a program/erase verifier circuit configured to control the sense amplifier, latch and I/O buffer to provided previously sensed data for a first memory cell to the program erase/verifier circuit for verification while the sense amplifier is sensing data for a second memory cell.

BRIEF DESCRIPTION OF THE DRAWINGS

The accompanying drawings are included to provide a further understanding of embodiments of the present invention, and are incorporated in and constitute a part of this specification. The drawings illustrate example embodiments of the present invention and, together with the description, serve to explain principles of the present invention. In the drawings.

DESCRIPTION OF EXEMPLARY EMBODIMENTS

Figure 1:
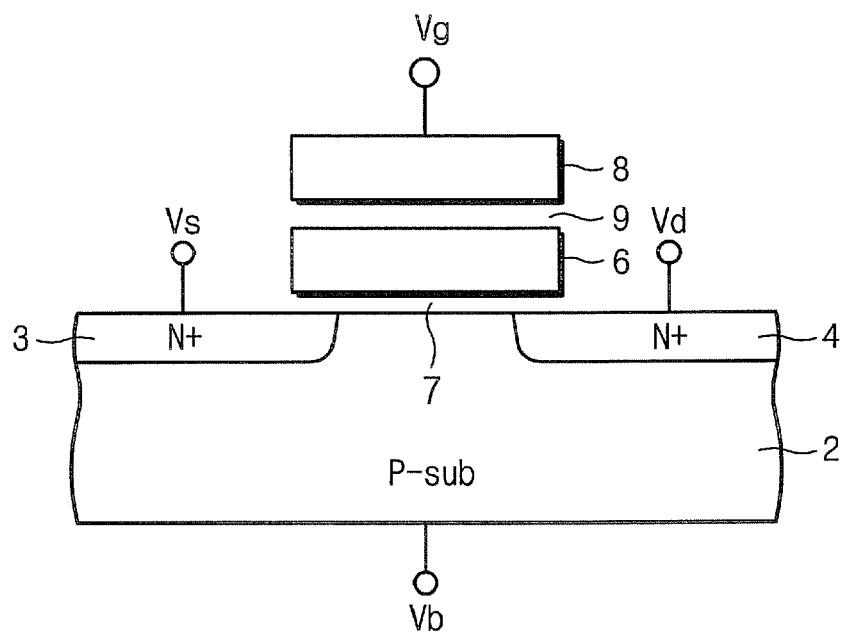
FIG. 1 is a cross-sectional diagram of a flash memory cell.
Figure 2:
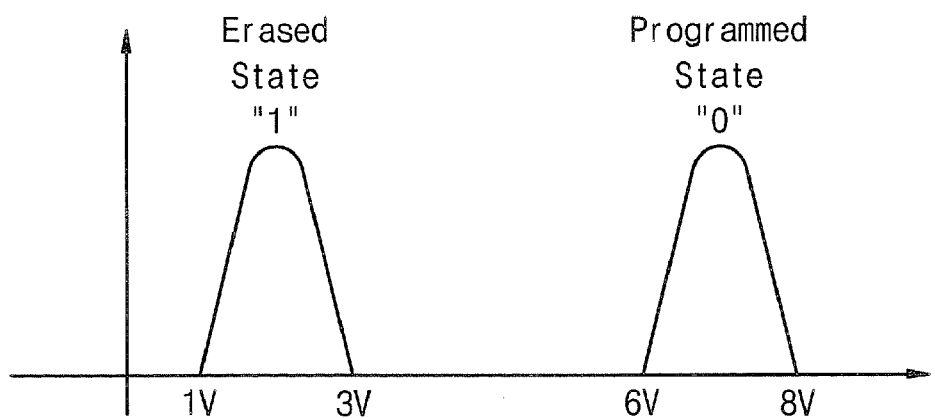
FIG. 2 shows variations of cell threshold voltages in accordance with programming and erasing operations in a flash memory device.

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. As used herein the term "and/or" includes any and all combinations of one or more of the associated listed items and may be abbreviated as "/".

It will be understood that, although the terms first and second may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, region, layer, or section discussed below could be termed a second element, region, layer, or section, and similarly without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Nonvolatile memory devices according to some embodiments of the present invention provide for the detection of data programmed or erased and verification of the detected result contemporaneously in a pipelining sequence. As a result, a time for verifying data programmed or erased may be reduced over non-pipelined techniques.

Figure 3:
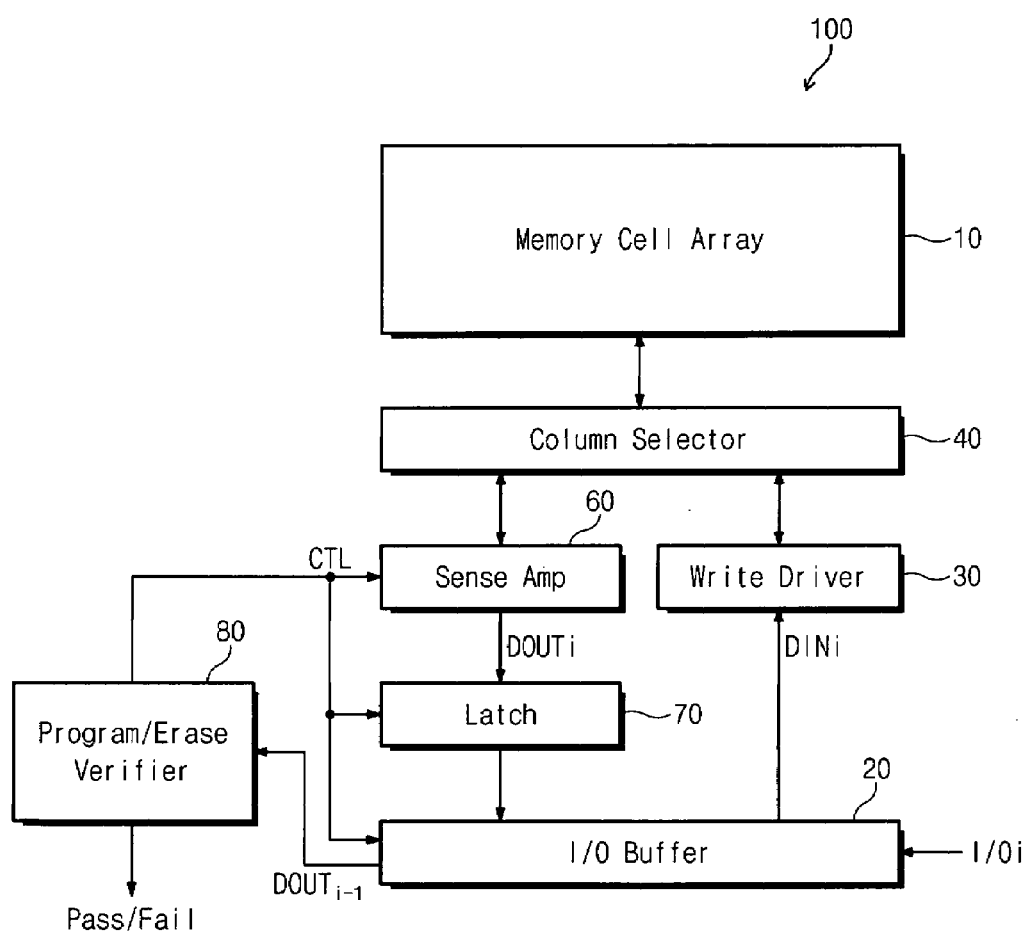
FIG. 3 is a block diagram of a flash memory device according to some embodiments of the present invention.

FIG. 3 is a block diagram of flash memory devices according to some embodiments of the invention. The memory devices illustrated in FIG. 3 generally include a cell array region that includes memory cells, and peripheral circuits for selecting rows and columns of the cell array region. If the cell array region is segmented into a plurality of blocks (or sectors), the peripheral circuits may also be divided into segments corresponding to the division of the cell array region, which has been well known by those skilled in this art. For clarity, embodiments of the present invention will be described herein with reference to one block (or sector) of the divided cell array region and its corresponding peripheral circuit. However, as will be appreciated by those of skill in the art in light of the present disclosure, additional peripheral circuitry may be provided if additional blocks are provided in the memory cell.

Referring to FIG. 3, a NOR flash memory device 100 inlcudes a memory cell array 10, an input/output buffer 20, a write driver 30, a column selector 40, a sense amplifier 60, a sense latch 70, and a programming/erasing verifier 80. The memory cell array 10 may include flash memory cells each with the structure shown in FIG. 1. The input/output buffer 20 stores data to be written into the memory cell array 10, and data detected from the memory cell array 10. The write driver 30 performs a programming or erasing operation for the memory cell array 10 with data input through the input/output buffer 20. The write driver 30 includes a latch (not shown) to store data to be programmed or erased, the data being supplied through the input/output buffer 20.

The sense amplifier 60 detects and amplifies data stored in a selected memory cell of the cell array 10 and may provide a data detection circuit. The data detected and amplified by the sense amplifier 60 is transferred to a corresponding address of the input/output buffer 20 through the sense latch 70. The sense latch 70 and the input/output buffer 20 may provide a data storage unit. The sense latch 70 stores the data (hereinafter, referred to as detected data) detected and amplified by the sense amplifier 60. For the purpose of simplifying the circuit architecture, the sense latch 70 may be smaller than the input/output buffer 20 in size. For example, the input/output buffer 20 may have storage capacity of 32 words to store all data to be programmed or erased, while the sense latch 70 may be sized to store 8 words.

The program/erase verifier 80, during detection of the $i^{th}$ programmed or erased data, receives previously detected programmed or erased data (i.e., i-$1^{th}$ data) from the input/output buffer 20 and verifies a pass or fail condition for the previously detected data. In other words, the program/erase verifier 80 controls the circuitry to detect data from the memory cell array 10 using the sense amplifier 60 and verify previously detected data in a pipeline. As a result, the time consumed in verifying data programmed or erased may be reduced and/or the need for a separate unit for verifying the programmed data and another unit for verifying the erased data may be avoided.

After the write driver 30 completes a programming or erasing operation for the memory cell array 10, the sense amplifier 60 detects and amplifies the data programmed or erased. Then, the sense amplifier 60 stores the detected and amplified data into the sense latch 70 under control of the programming/erasing verifier 80. The sense latch 70 also transfers the data from the sense amplifier 60 to a corresponding address of the input/output buffer 20 under control of the programming/erasing verifier 80. The sense latch 70 stores a newly detected result provided from the sense amplifier 60. The input/output buffer 20 provides the data from the sense latch 70 to the programming/erasing verifier 80 under the control of the programming/erasing verifier 80. The programming/erasing verifier 80, during detection of the $i^{th}$ programmed or erased data, receives previously detected programmed or erased data (i.e., i-$1^{th}$ data) from the input/output buffer 20 and verifies a pass or fail condition for the previously detected data. During the verification process, the programming/erasing verifier 80 may verify a programming or erasing state for each bit individually, or for multiple bits in common, for example, using a wired-OR pattern of the plurality of bits.

As such, the NOR flash memory device 100 performs detection of data programmed or erased and verification of previously detected results in an overlapping manner such that the detection of results and the verification of results occurs contemporaneously in a pipelining sequence. The procedure of verifying data programmed or erased in accordance with the present invention is as follows.

Figure 4:
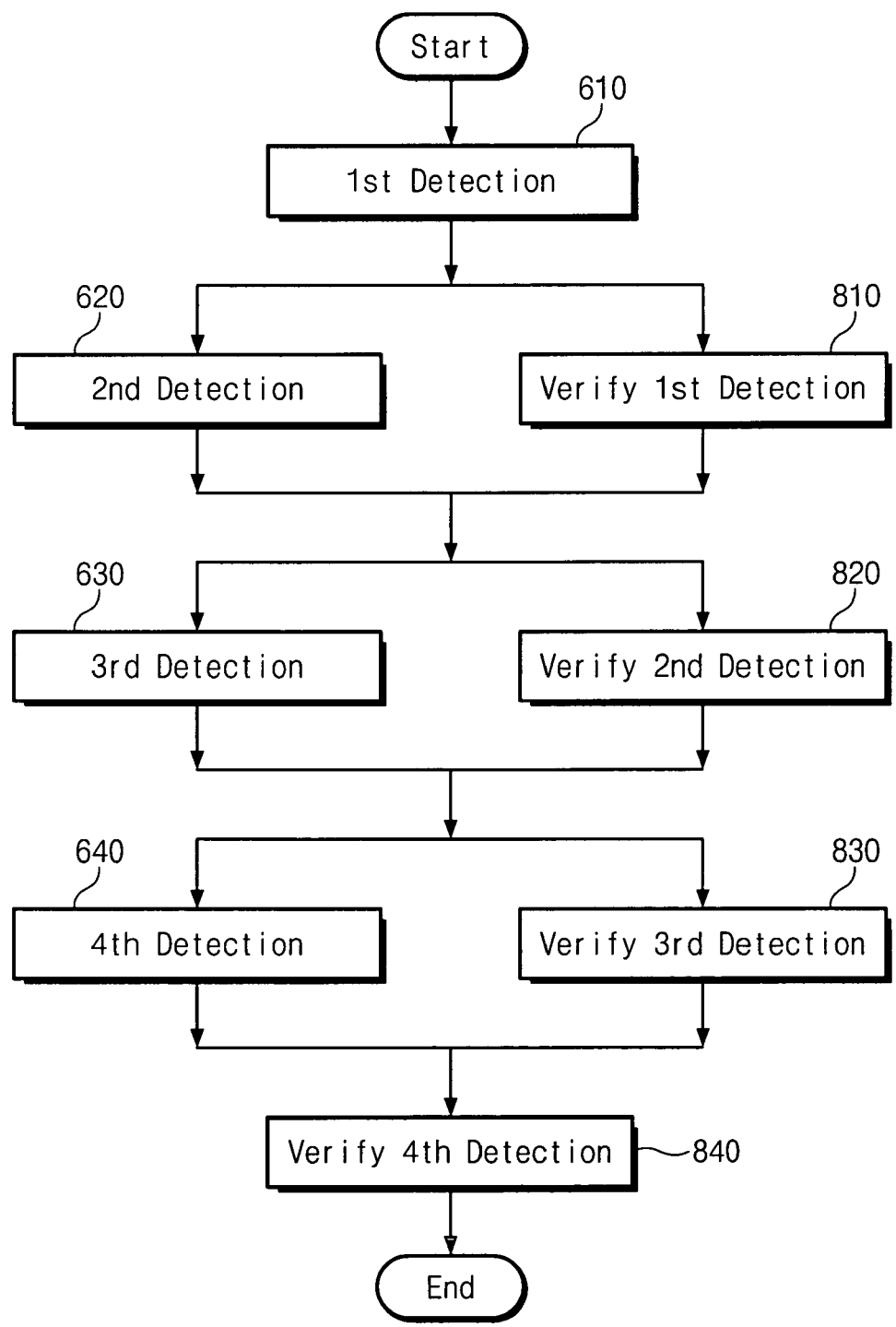
FIG. 4 is a flow chart showing a procedure of verifying data programmed or erased according to some embodiments of the present invention.
Figure 5:
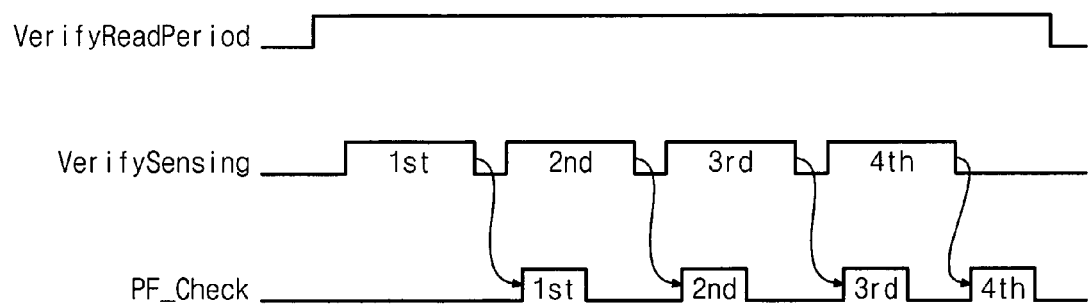
FIG. 5 is a timing diagram showing a sequence of verifying data programmed or erased in accordance with some embodiments of the present invention.

FIG. 4 is a flow chart showing a procedure of verifying data programmed or erased in accordance with some embodiments of the present invention. FIG. 5 is a timing diagram showing a sequence of verifying data programmed or erased in accordance with some embodiments of the present invention. While FIGS. 4 and 5 illustrate the case that the input/output buffer 20 includes 32 words and the sense latch 20 includes 8 words, the storage capacities of the input/output buffer 20 and the sense latch 70 may be modified without departing from the teachings of the present invention. Thus, the embodiments illustrated in FIGS. 4 and 5 show four detection and verification operations to detect and verify the 32 words in the input/output buffer 20, other numbers of detection and verification operations may be provided in accordance with structural features of the input/output buffer 20 and the sense latch 70.

Referring to FIGS. 4 and 5, during the VerifyReadPeriod, the sense amplifier 60 carries out a first sensing operation to detect programmed or erased data in response to the control of the programming/erasing verifier 80 (block 610). A first sensed result SENSE1 by the first sensing operation is stored in the sense latch 70 in response to the control of the programming/erasing verifier 80 and then transferred into a corresponding address of the input/output buffer 20. The operational timing of the sensing and transfer of the sensed data to the input/output buffer 20 is illustrated in FIG. 5 as the first VerifySensing operation.

Subsequently, the sense amplifier 60 performs a second sensing operation to detect the next programmed or erased data in response to the control of the programming/erasing verifier 80 (block 620). Concurrently with the sensing operation, the programming/erasing verifier 80 receives the first sensed result SENSE1 from the input/output buffer 20 and then verifies it (block 810). As illustrated in FIG. 5, during the second VerifySensing operation, the first PF_Check operation is concurrently carried out for the first sensed result SENSE1 in a pipelining sequence. Thus, immediately previously detected data is verified during detection of current data. During the second VerifySensing operation, the second sensed result SENSE2 is stored in the sense latch 70 in response to the control of the programming/erasing verifier 80 and then transferred into a corresponding address of the input/out buffer 20. As discussed above, the programming/erasing verifier 80 may verify the programming or erasing state in a bitwise manner or in a multiple bit manner, such as using a wired-OR to determine if any of multiple bits are set to a particular state.

The sense amplifier 60 subsequently executes a third sensing operation to detect programmed or erased data in response to the control of the programming/erasing verifier 80 (block 630). Concurrently with the third sensing operation, the programming/erasing verifier 80 receives the second sensed result SENSE2 from the input/output buffer 20 and verifies the second sensed result (block 820). As illustrated in FIG. 5, during the third VerifySensing operation, the second PF_Check operation is concurrently carried out for the second sensed result SENSE2 in a pipelining sequence. During the third sensing operation, the third sensed result SENSE3 is stored in the sense latch 70 in response to the control of the programming/erasing verifier 80 and then transferred into a corresponding address of the input/out buffer 20.

A fourth sensing operation (the 4th VerifySensing) to provide a fourth sensed result SENSE4 and a third verifying operation (3rd PF_Check) for the third sensed result SENSE3 are also concurrently carried out (blocks 640 and 830). Subsequently, a fourth verifying operation (4th PF_Check) for the fourth sensed result SENSE4 is carried out (block 840).

As used herein, the term concurrently carried out refers to at least some overlap in time between the sense operation and the verification operation. Thus, some embodiments of the present invention may provide for overlapped sensing and verification operations. Furthermore, because some embodiments of the present invention provide for pipelined sensing and verification operations, because the pipeline may need to be primed and flushed, some sensing and verification operations may occur without a corresponding other of the sensing and verification operations. Thus, pipelined or overlapped sensing and verification operations refers to operations where at least one sensing operation is carried out concurrently with at least one verification operation and need not be all sensing and verification operations.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A nonvolatile memory device comprising:
   a data detection circuit configured to sense data of a selected memory cell of a memory cell array after a programming or erasing operation of the selected memory;
   a data storage unit configured to store the sensed data; and
   a verifier circuit configured to verify programmed or erased data stored in the data storage unit while the data detector is sensing new programmed or erased data.

2. The nonvolatile memory device of claim 1, wherein the verifier circuit controls the data input and output operations for the data storage unit.

3. The nonvolatile memory device of claim 1, wherein the verifier circuit confirms the programmed or erased state individually for each bit of the data.

4. The nonvolatile memory device of claim 1, wherein the verifier circuit confirms the programmed or erased state commonly for a plurality of bits of the data.

5. A nonvolatile memory device comprising:
   a first data storage unit configured to store data for programming or erasing memory cells of the nonvolatile memory device;
   a data detector circuit configured to sense data of a selected memory cell after a programming or erasing operation with the data stored in the first data storage unit;
   a second data storage unit configured to store the sensed data; and
   a verifier circuit configured to transfer the sensed data from the second data storage unit to the first data storage unit and verify the sensed data stored in the first data storage unit concurrent with the data detector circuit sensing new programmed or erased data.

6. The nonvolatile memory device of claim 5, wherein the verifier circuit controls data input and output operations for the first and second data storage units.

7. The nonvolatile memory device of claim 5, wherein the verifier circuit confirms the programmed or erased state for each bit of the data individually.

8. The nonvolatile memory device of claim 5, wherein the verifier circuit confirms the programmed or erased state commonly for a plurality of bits of the data.

9. The nonvolatile memory device of claim 5, wherein the first data storage unit is an input/output buffer.

10. The nonvolatile memory device of claim 5, wherein the second data storage unit is a latch circuit.

11. The nonvolatile memory device of claim 5, wherein the first data storage unit couples the data for programming or erasing memory cells of the nonvolatile memory device via a column selector, and wherein the data detector circuit is configured to sense the data of the selected memory cell via the column selector.

12. A method of verifying data in a nonvolatile memory device, the method comprising:
   concurrently detecting data for a selected memory cell of the nonvolatile memory device and verifying a programmed or erase state of previously detected data of a different memory cell of the nonvolatile memory device.

13. The method of claim 12 wherein the previously detected data comprises detected data that was immediately previously detected.

14. The method of claim 12, further comprising programming or erasing memory cells of the nonvolatile memory device with external data of a first data storage unit.

15. The method of claim 12, concurrently detecting data for a selected memory cell and verifying a programmed or erase state of previously detected data comprises confirming the programmed or erase state for each bit of the data individually.

16. The method of claim 12, concurrently detecting data for a selected memory cell and verifying a programmed or erase state of previously detected data comprises confirming the programmed or erase state commonly for a plurality of bits of the data.

17. The method of claim 14 wherein a result of the data detection is stored in a second data storage unit.

18. The method of claim 14, wherein concurrently detecting data for a selected memory cell and verifying a programmed or erase state of previously detected data comprises:
   storing the data from the second storage unit in the first data storage unit; and
   verifying a programmed or erase state for the data stored in the first data storage unit while detecting new data.

19. A method of verifying data in a nonvolatile memory device, the method comprising:
   programming or erasing data for memory cells of a memory cell array with data stored in a first data storage unit;
   sensing data of a selected memory cell;
   storing the data sensed from the selected memory cell in a second storage unit;
   storing the data from the second storage unit in the first data storage unit; and
   concurrently detecting new data and verifying a programmed or erase state for the data stored in the first data storage unit.

20. A nonvolatile memory device, comprising:
   a memory cell array including a plurality of memory cells; and
   means for concurrently detecting data of a selected one of the memory cells and verifying a programmed or erase state of previously detected data of a different one of the memory cells.

21. The nonvolatile memory device of claim 20, wherein the means for concurrently detecting data and verifying a programmed or erase state comprises:
   a sense amplifier configured to sense data from the one of the memory cells;
   a latch configured to store the data sensed by the sense amplifier;
   an I/O buffer that is configured to store the data stored in the latch; and
   a program/erase verifier circuit that is configured to control the sense amplifier, latch and I/O buffer to provide previously sensed data for a first memory cell to the program erase/verifier circuit for verification while the sense amplifier is sensing data for a second memory cell.

* * * * *

UNITED STATES PATENT AND TRADEMARK OFFICE
CERTIFICATE OF CORRECTION

PATENT NO.       : 7,266,029 B2
APPLICATION NO.  : 11/017335
DATED            : September 4, 2007
INVENTOR(S)      : Jeong It is certified that error appears in the above-identified patent and that said Letters Patent is hereby corrected as shown below:

On title page:
Add item --(73) Assignee:  Samsung Electronics Co., Ltd.,
                           Gyeonggi-do  (KR)

Signed and Sealed this

Twenty Second Day of April, 2008

JON W. DUDAS
*Director of the United States Patent and Trademark Office*

UNITED STATES PATENT AND TRADEMARK OFFICE
CERTIFICATE OF CORRECTION

PATENT NO.         : 7,266,029 B2
APPLICATION NO. : 11/017335
DATED                : September 4, 2007
INVENTOR(S)       : Jeong It is certified that error appears in the above-identified patent and that said Letters Patent is hereby corrected as shown below:

On title page:

Add item --(73) Assignee: Samsung Electronics Co., Ltd.,
Gyeonggi-do (KR)--

Signed and Sealed this

Thirteenth Day of May, 2008

JON W. DUDAS
*Director of the United States Patent and Trademark Office*